(12) United States Patent
Chang

(10) Patent No.: US 6,450,248 B1
(45) Date of Patent: Sep. 17, 2002

(54) HEAT SINK RETAINER

(75) Inventor: Ching-Sheng Chang, Taipei Hsein (TW)

(73) Assignee: Hoya Tech Co., Ltd., Chung-Ho (TW)

( * ) Notice: Subject to any disclaimer, the term of this patent is extended or adjusted under 35 U.S.C. 154(b) by 0 days.

(21) Appl. No.: 10/020,029

(22) Filed: Oct. 29, 2001

(51) Int. Cl.⁷ ................................................. F28F 7/00
(52) U.S. Cl. ...................... 165/80.3; 165/121; 165/185; 257/718; 257/726; 257/727; 248/510; 24/458; 361/710; 361/697
(58) Field of Search ................................ 165/80.3, 121, 165/185; 361/697, 704, 709, 710; 257/718, 719, 726, 727; 24/457, 458; 248/505, 510

(56) References Cited

U.S. PATENT DOCUMENTS

| | | | | |
|---|---|---|---|---|
| 5,828,553 A | * | 10/1998 | Chiou | 165/80.3 |
| 5,870,288 A | * | 2/1999 | Chen | 165/185 |
| 5,979,025 A | * | 11/1999 | Horng | 165/80.3 |
| 5,991,152 A | * | 11/1999 | Chiou | 361/704 |
| 6,049,457 A | * | 4/2000 | Lee | 361/704 |
| 6,082,440 A | * | 7/2000 | Clemens et al. | 165/80.3 |
| 6,181,559 B1 | * | 1/2001 | Seo | 361/704 |
| 6,205,026 B1 | * | 3/2001 | Wong et al. | 361/704 |
| 6,311,766 B1 | * | 11/2001 | Lin | 165/80.3 |
| 6,332,251 B1 | * | 12/2001 | Ho et al. | 24/458 |
| 6,343,013 B1 | * | 1/2002 | Chen | 361/695 |
| 6,381,836 B1 | * | 5/2002 | Lauruhn et al. | 165/185 |

* cited by examiner

*Primary Examiner*—Henry Bennett
*Assistant Examiner*—Terrell McKinnon
(74) *Attorney, Agent, or Firm*—Belasco Jacobs & Townsley, LLP; David A. Belasco

(57) ABSTRACT

A heat sink retainer has a rectangle frame with four corners each having a slit defined through the corner. A pair of U shape clamping strips each has two legs. Each leg extends through a corresponding one of the slits. A controlling device pivotally connects to each of the clamping strips and has two driving bosses and each driving boss is integrally formed on a distal end of the controlling device and is clamped between the frame and the clamping strip to control movement of the distal ends of the clamping strip to engage/disengage with holes in the heat sink.

8 Claims, 3 Drawing Sheets

HEAT SINK RETAINER

BACKGROUND OF THE INVENTION

1. Field of the Invention

The present invention relates to a retainer, and more particularly to a heat sink retainer to easily assemble and/or disassemble the heat sink for installation and/or repair.

2. Description of Related Art

Heat transfer is an important factor to performance of integrated circuits. Although a wide variety of heat sink retainers have been provided before, the results have not been satisfactory in all aspects. Users of the retainers still have to use both hands to operate the retainers. Under the limited space in an integrated circuit, there is only a small space available for the user. Thus, it is quite difficult for the user to work with the heat sink retainers by both hands.

To overcome the shortcomings, the present invention tends to provide an heat sink retainer to mitigate and obviate the aforementioned problems.

SUMMARY OF THE INVENTION

The primary objective of the invention is to provide a heat sink retainer to easily disassemble and assemble the heat sink within a limited space.

In order to accomplish the foregoing objective, the heat sink retainer has a rectangle frame with four comers each having a slit defined through the corner;

a pair of U shape clamping strips each having two distal ends extending through two adjacent slits; and a controlling device pivotally connected to two clamping strips and having two driving bosses each integrally formed on a distal end of the controlling device and received between the frame and the clamping strip to operate the distal ends of the clamping strip to engage/disengage with holes in the heat sink.

Other objects, advantages and novel features of the invention will become more apparent from the following detailed description when taken in conjunction with the accompanying drawings.

DETAILED DESCRIPTION OF THE PREFERRED EMBODIMENT

Figure 1:
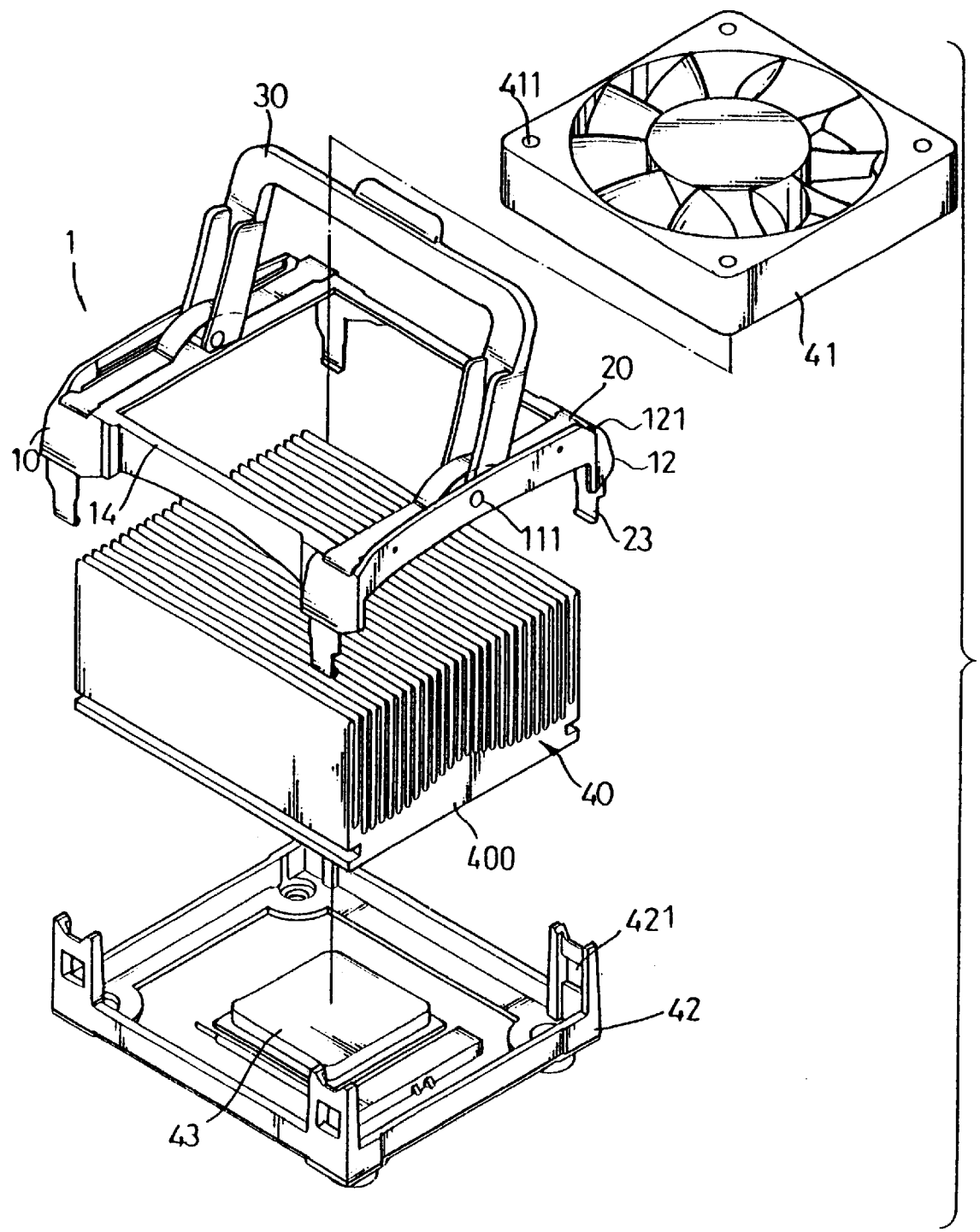
FIG. 1 is an exploded perspective view of the retainer of the invention together with the heat sink.

With reference to FIG. 1, the retainer in accordance with the present invention together with a heat sink (40) is shown. The heat sink (40) has a fan (41), a heat dissipator (400) and a base (42) with a chip (43) mounted on the base (42). Because none of the fan (41), the heat dissipator (400) and the base (42) is new and is not the focus of the invention, detailed description thereof is thus omitted.

The retainer of the present invention has a frame (10), a pair of clamping strips (20) and a controlling device (30).

Figure 2:
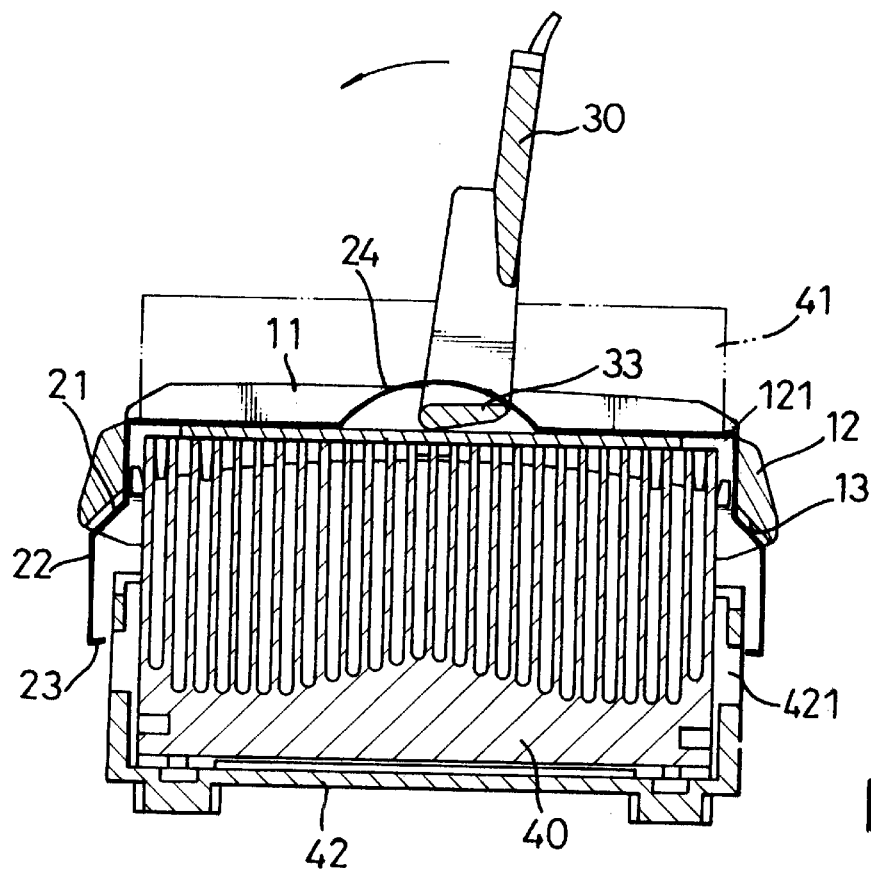
FIG. 2 is a cross sectional view of the retainer assembled with the heat sink.

With reference to FIGS. 1 and 2, the frame (10) is a rectangle one and has four corners (12). Each corner (12) is provided with a slit (121) defined through the corner (12) and a first sloping face (13) defined in an inner face of the corner (12). A mounting space (14) is defined in the frame (10) so that the fan (41) is able to be received in the mounting space (14).

Each of the pair of clamping strips (20) has a U shape and has a bent (21) formed on a mediate portion of each of the legs (22) to correspondingly mate with the sloping face (13) of the corner (12) of the frame (10). Each distal end of the clamping strip (20) has a hook (23). An arcuate portion (24) is formed between two legs (22).

The controlling device (30) is a U shaped one and has an elliptic boss (33) formed at each distal end of the U shaped controlling device (30) to correspond to the arcuate portion (24) of the clamping strip (20).

Figure 3:
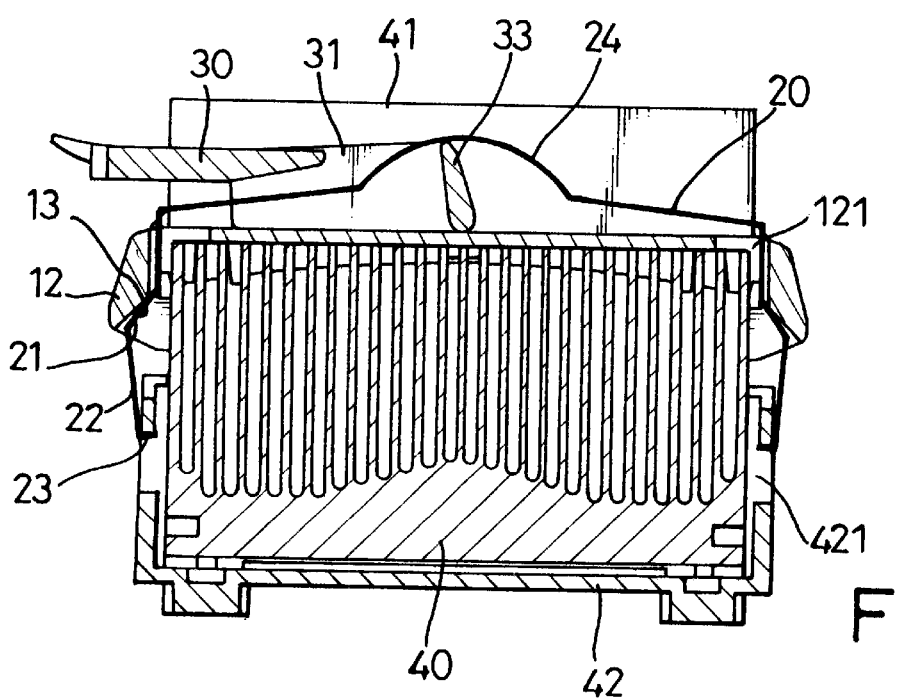
FIG. 3 is an operational side plan view in section, wherein the controlling device is pivoted to drive the clamping strip to engage with holes in the heat sink.
Figure 4:
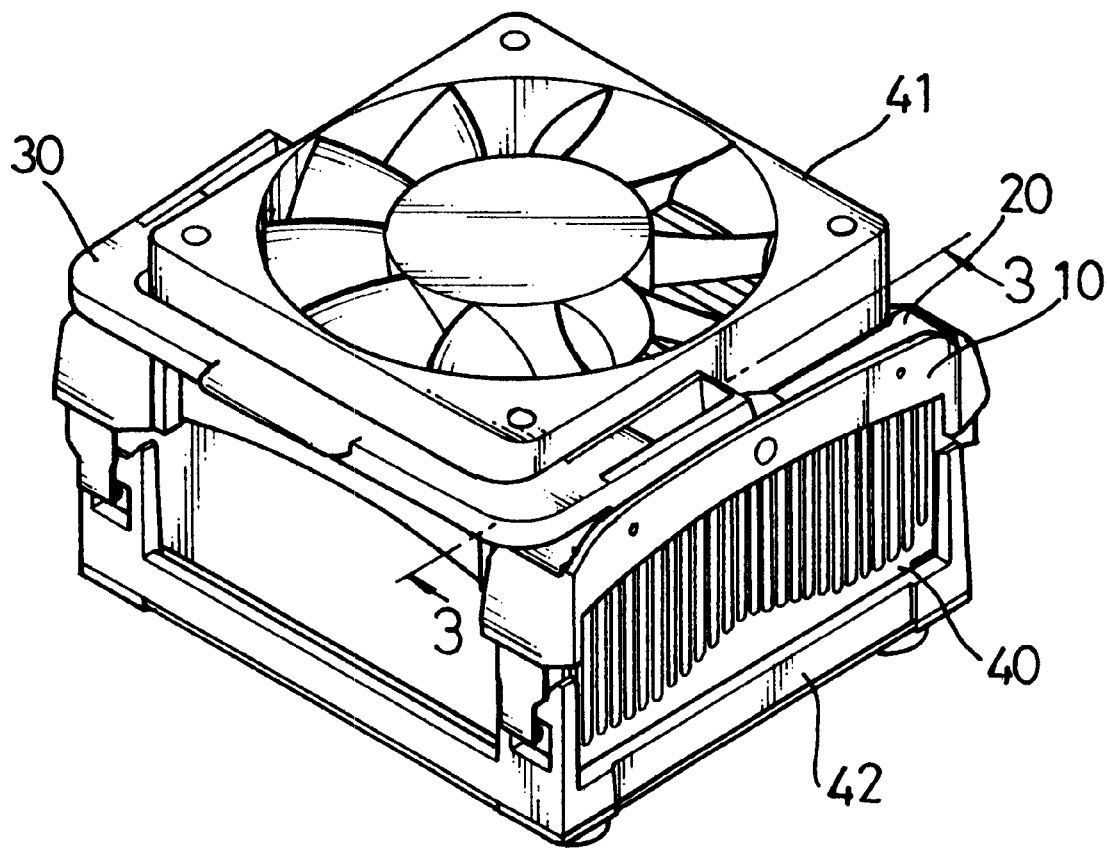
FIG. 4 is a perspective view showing the assembled heat sink by the retainer of the present invention.

With reference to FIGS. 2 and 3, when the retainer is assembled, the elliptic bosses (33) are respectively received under a corresponding one of the arcuate portions (24). Then, each leg (22) of the clamping strips (20) is inserted through a corresponding one of the slit (121) in the corner (12) to expose the hook (23) and to have the elliptic bosses (33) to be clamped between the frame (10) and the arcuate portion (24). A pin (111) is inserted through side faces of the distal end of the controlling device (30) and into the clamping strip (20) to have the distal end of the controlling device (30) to be pivotally connected to the clamping strip (20).

After the assembly of the retainer of the present invention, the mounting of the fan (41) and the heat dissipator (40) on the mounting space (14) can be accomplished by screws extending through a top face of the fan (41) and into the heat dissipator (400) so that the fan (41) together with the heat dissipator (400) is securely mounted on the retainer. Then, the pivotal movement of the controlling device (30) will control the movement of the distal end, the hook (23), to move. That is the hooks (23) are controlled to move to or away from the holes (421) of the base (421) so as to accomplish the engagement or disengagement with the base (42).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A the heat sink retainer comprising:

a rectangle frame with four corners each having a slit defined through the corner;

a pair of U shape clamping strips each having two distal ends, each leg extending through a corresponding one of the slits; and a controlling device pivotally connected to each of the clamping strips and having two driving bosses each integrally formed on a distal end of the controlling device and clamped between the frame and the clamping strip to control movement of the distal ends of the clamping strip to engage/disengage with holes in the heat sink.

2. The heat sink retainer as claimed in claim 1, wherein each of the corners has a sloping face formed on an inner face of the corner, each leg has a bent formed to matingly correspond to each of the sloping faces so that the movement of the distal ends of the legs are confined.

3. The heat sink retainer as claimed in claim 2, wherein each clamping strip has an arcuate portion formed on a mediate portion of the clamping strip to clamp the driving boss with the frame.

4. The heat sink retainer as claimed in claim 1, wherein each of the driving bosses is elliptic in section.

5. The heat sink retainer as claimed in claim 2, wherein each of the driving bosses is elliptic in section.

6. The heat sink retainer as claimed in claim 3, wherein each of the driving bosses is elliptic in section.

7. The heat sink retainer as claimed in claim 3, wherein the frame has a mounting space defined to mount the fan and the heat dissipator.

8. The heat sink retainer as claimed in claim 4, wherein the frame has a mounting space defined to mount the fan and the heat dissipator.

* * * * *